United States Patent
Yamazaki

(10) Patent No.: US 7,266,794 B2
(45) Date of Patent: Sep. 4, 2007

(54) APPARATUS FOR AND METHOD OF ANALYZING TRANSMISSION CHARACTERISTICS OF A CIRCUIT APPARATUS

(75) Inventor: Manabu Yamazaki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 316 days.

(21) Appl. No.: 10/939,336

(22) Filed: Sep. 14, 2004

(65) Prior Publication Data

US 2005/0246669 A1    Nov. 3, 2005

(30) Foreign Application Priority Data

Apr. 28, 2004    (JP)    ............................. 2004-134383

(51) Int. Cl.
    *G06F 17/50*    (2006.01)
(52) U.S. Cl. .............................................. 716/5; 716/6
(58) Field of Classification Search .................... 716/1, 716/4–6
    See application file for complete search history.

(56) References Cited

FOREIGN PATENT DOCUMENTS

| JP | 07-302258 | 11/1995 |
|----|-----------|---------|
| JP | 07-302277 | 11/1995 |
| JP | 2002-288241 | 10/2002 |

OTHER PUBLICATIONS

Massoud et al., "FastMag: A 3-D Magnetostatic Inductance Extraction Program for Structure with Permeable Materials," IEEE, Nov. 2002, pp. 478-484.*
Daniel et al., "Techniques for Including Dielectrics when Extracting Passive Low-Order Models of High Speed Interconnect," ACM, 2001, pp. 240-244.*
Kamon et al., "Interconnect Parasitic Extraction in teh Digital IC Design Methodoloty," IEEE, 1999, pp. 223-230.*
Kamon et al. "Interconnect Analysis: From 3-D Structures to CIrcuit Models," ACM, 1999, pp. 910-914.*

* cited by examiner

*Primary Examiner*—Vuthe Siek
(74) *Attorney, Agent, or Firm*—Staas & Halsey LLP

(57) ABSTRACT

A method of analyzing transmission characteristics of signal wiring in a circuit apparatus including the signal wiring and insulative layer is disclosed. The transmission characteristics are analyzed by dividing the circuit apparatus with a mesh and applying electromagnetic analysis method to each unit of the mesh. The method includes the steps of: extracting signal wiring data from 3 dimensional data of the circuit apparatus; designating a sparse mesh region in which the mesh can be made sparse based on the extracted signal wiring data and the 3 dimensional data; and generating sparse mesh in the sparse mesh region. Since the sparse mesh region is designated based on the sizes of the signal wiring and the insulative layer and on the electric properties of the insulative layer, a region that affects the transmission characteristics of the signal wiring only to a small extent can be designated as the sparse mesh region.

10 Claims, 6 Drawing Sheets

APPARATUS FOR AND METHOD OF ANALYZING TRANSMISSION CHARACTERISTICS OF A CIRCUIT APPARATUS

BACKGROUND OF THE INVENTION

1. Field of the Invention

The present invention generally relates to a method of and an apparatus for analyzing a circuit, and more particularly, to a method of and apparatus for analyzing the transmission characteristics of a circuit apparatus such as an electric circuit, an electronic circuit, and an integrated circuit.

2. Description of the Related Art

Recently, the data transmission speed of an image processing apparatus and a communication apparatus, for example, is increasing even to more that 1 GHz. In the case of such a high frequency signal, the transmission characteristics of a signal may be considerably different from that of a low frequency signals. For example, if a transmission channel has a perpendicular corner, current density at the inside of the corner becomes greater than that of the outside of the corner. In addition, since a reflection factor increases, current loss also increases. In such a case, if the signal integrity of the circuit apparatus is not verified, the circuit apparatus may fail to transmit data normally. Accordingly, it is important to verify the signal integrity by analyzing the transmission characteristics using simulation.

The signal integrity of a circuit apparatus can be verified as follows. Three dimensional data of the circuit apparatus such as an electronic circuit board is generated. The 3 dimensional data includes transmission wirings, insulative layers surrounding the transmission wirings, and conductive layers such as a power supply layer and a ground layer. From the 3 dimensional data, 2 or 3 dimensional mesh is generated thereby to divide the circuit apparatus with the generated mesh. As a result, the circuit apparatus is made discrete. Electromagnetic analysis method is applied to each unit of mesh so as to obtain electric property parameters such as a "S" parameter of the transmission wiring.

Conventionally, two methods have been employed for obtaining the electric property parameters of the circuit apparatus. According to a first method, the entire circuit apparatus is covered with a uniformly generated mesh for performing the electromagnetic analysis for each unit of the mesh. According to a second method, the circuit apparatus is first divided into multiple portions, and each portion of the circuit apparatus is covered with a mesh generated for each portion for performing the electromagnetic analysis.

Japanese Laid-Open Patent Applications No. 2002-288241, No. 7-302277, and No. 7-302258 disclose inventions relevant to the related art.

However, according to the first method described above, the uniformly generated mesh covers such region of the insulative layer that no transmission wiring is formed therein and such region of the power supply layer and ground layer that are not adjacent to the transmission wiring. The problem is that a long time is required for generating the mesh and analyzing the electromagnetic field in such regions.

According to the second method described above, the time required for generating the mesh and analyzing the electromagnetic field in the circuit apparatus can be reduced since the multiple portions of the circuit apparatus can be processed concurrently. However, the problem is that the 3 dimensional data needs to be modified for dividing the circuit apparatus into multiple portions, and the electric property parameters obtained as a result of the electromagnetic analysis need to be combined.

SUMMARY OF THE INVENTION

Accordingly, it is a general object of the present invention to provide a novel and useful method and apparatus in which one or more of the problems described above are eliminated.

Another and more specific object of the present invention is to provide a method of and an apparatus for analyzing a circuit apparatus that can reduce time required for the analysis. Yet another object of the present invention is to provide a computer program that causes a computer to perform the method according to the present invention.

To achieve at least one of the above objects, according to an aspect of the present invention, a method of analyzing transmission characteristics of signal wiring in a circuit apparatus including the signal wiring and insulative layer surrounding the signal wiring by dividing the circuit apparatus with a mesh and applying electromagnetic analysis method to each unit of the mesh, the method includes the steps of: extracting signal wiring data of the signal wiring from 3 dimensional data of the circuit apparatus; designating a sparse mesh region in which the mesh can be made sparse based on the extracted signal wiring data and the 3 dimensional data of the circuit apparatus; and generating sparse mesh in the sparse mesh region, wherein the sparse mesh region is designated based on sizes of the signal wiring and the insulative layer and on electric properties of the insulative layer.

Since the sparse mesh region is designated based on the sizes of the signal wiring and the insulative layer and on the electric properties of the insulative layer, a region that affects the transmission characteristics of the signal wiring only to a small extent can be designated as the sparse mesh region. Accordingly, the number of the units of mesh (mesh units) can be reduced (the mesh is made sparse) and consequently, the time required for the analysis of the circuit apparatus can be reduced by changing at least one property of the designated sparse mesh region.

According to another aspect of the present invention, a computer program that causes a computer to perform the above method can be provided.

According to yet another aspect of the present invention, also provided is an apparatus for analyzing transmission characteristic of signal wiring in a circuit apparatus including the signal wiring and insulative layer surrounding the signal wiring by dividing the circuit apparatus with a mesh and applying electromagnetic analysis method to each unit of the mesh, the apparatus comprising: a model replacement unit that identifies region data in 3 dimensional data in which the mesh is to be made sparse; and a mesh generating unit that generates sparse mesh in the region based on the 3 dimensional data, wherein the region is designated based on the size of the signal wiring and the insulative layer, and the electric properties of the insulative layer.

Other objects, features, and advantages of the present invention will be more apparent from the following detailed description when read in conjunction with the accompanying drawings.

DETAILED DESCRIPTION OF THE PREFERRED EMBODIMENTS

The preferred embodiment of the present invention are described below with reference to the drawings.

Figure 1:
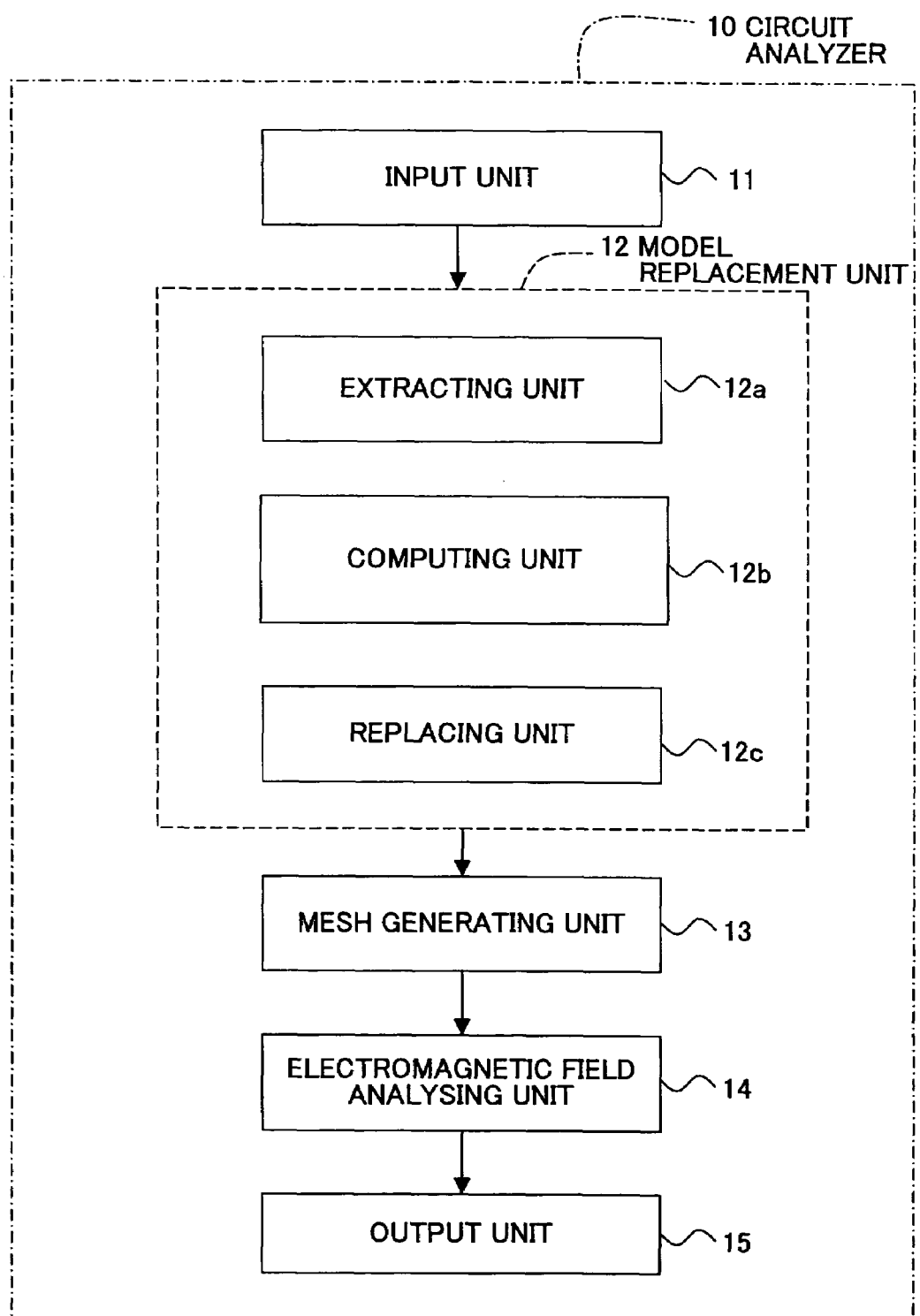
FIG. 1 is a block diagram showing the functional structure of a circuit analyzer according to an embodiment.

FIG. 1 is a block diagram showing the functional structure of a circuit analyzer according to an embodiment. Referring to FIG. 1, the circuit analyzer 10 according to an embodiment includes an input unit 11 for inputting 3 dimensional data of an electric circuit apparatus, a model replacement unit 12 for replacing based on the 3 dimensional data a region that affects to a small extent or does not affect the transmission characteristics of the electric circuit apparatus with a model in which the number of mesh units to be generated is reduced. The circuit analyzer 10 further includes a mesh generating unit 13 for meshing the electric circuit apparatus based on the replaced 3 dimensional data, an electromagnetic field analyzing unit 14 for analyzing the transmission characteristics of the signal wiring of the electric circuit apparatus, and an output unit 15 for outputting analysis result.

The input unit 11 is configured to be fed the 3 dimensional data of the electric circuit apparatus to be analyzed. For example, the input unit 11 may be configured to receive data output from a computer aided design (CAD) apparatus for supporting the design of the electric circuit apparatus. The 3 dimensional data of the electric circuit apparatus may contain, for example, information related to position and material of intra layer signal wiring, vertical signal wiring such as vias and plugs, power supply layers, ground layers, inter layer insulating layers. The power supply layers and the ground layers may be hereinafter referred to as "V/G layers."

The model replacement unit 12 includes a extracting unit 12a for extracting signal wiring data from the 3 dimensional data of the electric circuit apparatus, a computing unit 12b for computing a region that affects the transmission characteristics of the signal wiring to some limited extent or that does not affect them, and a replacing unit 12c for generating a model, for example, by replacing the material of the region with new material that reduces the number of mesh units to be generated in the region.

The extracting unit 12a is configured to extract the information related to signal wiring to be analyzed from the 3 dimensional data of the electric circuit apparatus. The signal wiring information may contain the coordinates and widths of the intra layer signal wiring and the vertical signal wiring such as vias and plugs.

The computing unit 12b is configured to compute a region that affects the transmission characteristics of the signal wiring to a small extent, for example, a region being separated from the signal wiring by a predetermined distance or satisfying a predetermined set of conditions, based on the signal wiring information extracted by the extracting unit 12a.

The replacing unit 12c is configured, for example, to replace the material of the region computed by the computing unit 12b with material that reduces the number of mesh units to be generated by the mesh generating unit 13 (to be described below) thereby to generate a new model of the electric circuit apparatus.

The mesh generating unit 13 is configured to divide the newly generated model with 2 dimensional or 3 dimensional mesh based on prescribed algorithm.

The electromagnetic analyzing unit 14 computes, for example, the transmission characteristics and scattering (S) parameters (including frequency dependency thereof), for example, of the model of the electric circuit apparatus divided by the mesh using an electromagnetic analysis technique. The electromagnetic analysis technique may be any suitable technique known in the art such as moment method, finite element method, boundary element method, finite difference time domain method, and transmission line matrix method. The S parameter information includes incidental factors and reflective factors at ports (input and output ports) designated in the signal wiring. The S parameter is computed for each frequency. It is possible to obtain the frequency dependency of the signal loss of the signal wiring using the S parameter.

The output unit 15 is configured to output the obtained transmission characteristics of the signal wiring and the S parameter information to a storing unit (not shown) or a printer (not shown).

Figure 2A:
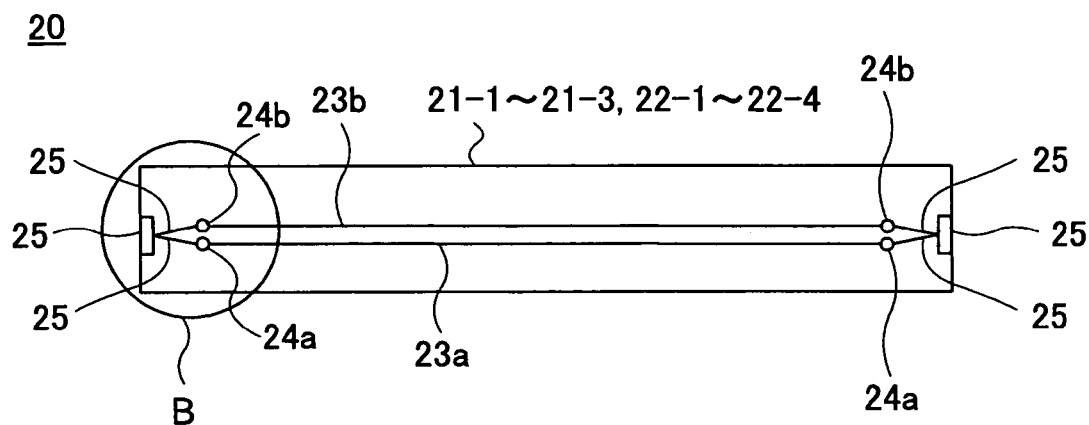
FIG. 2A is a top view showing an electric circuit to be analyzed by the circuit analyzer.
Figure 2B:
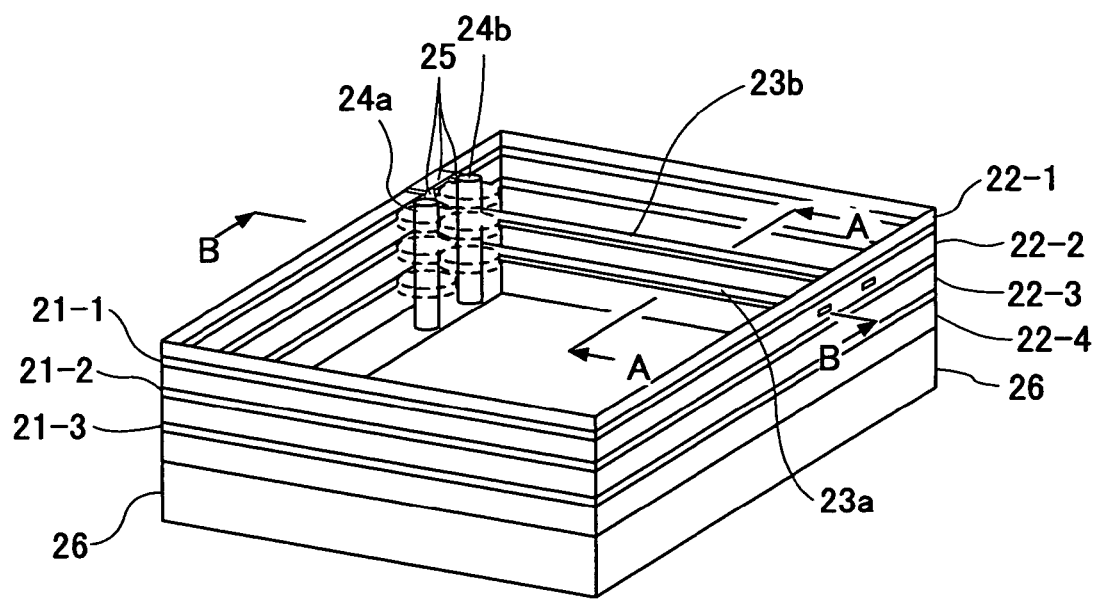
FIG. 2B is an elevational expanded view of the portion B shown in FIG. 2A.
Figure 3:
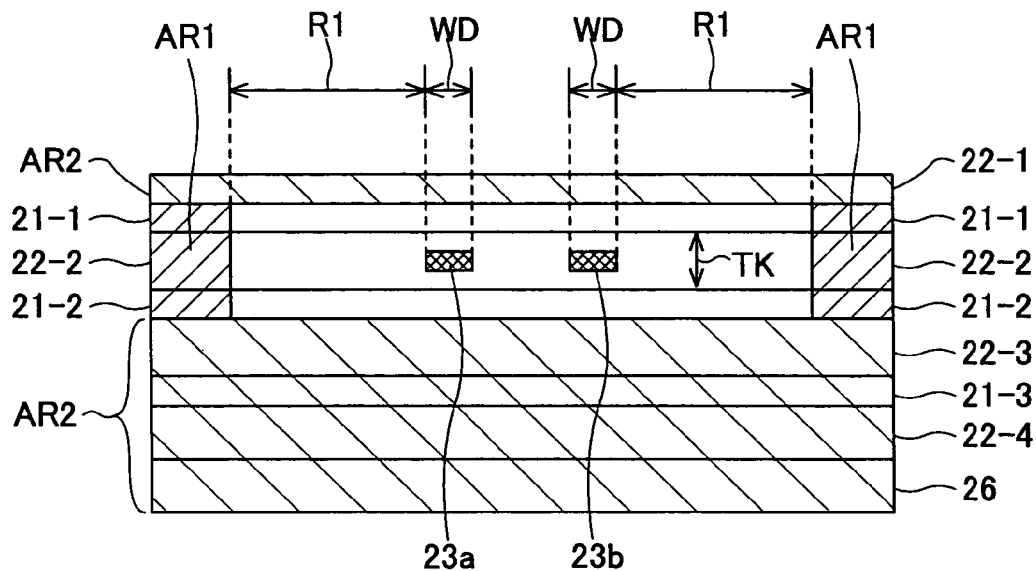
FIG. 3 is a cross-sectional view of the electric circuit shown in FIG. 2B along a line A-A.
Figure 4:
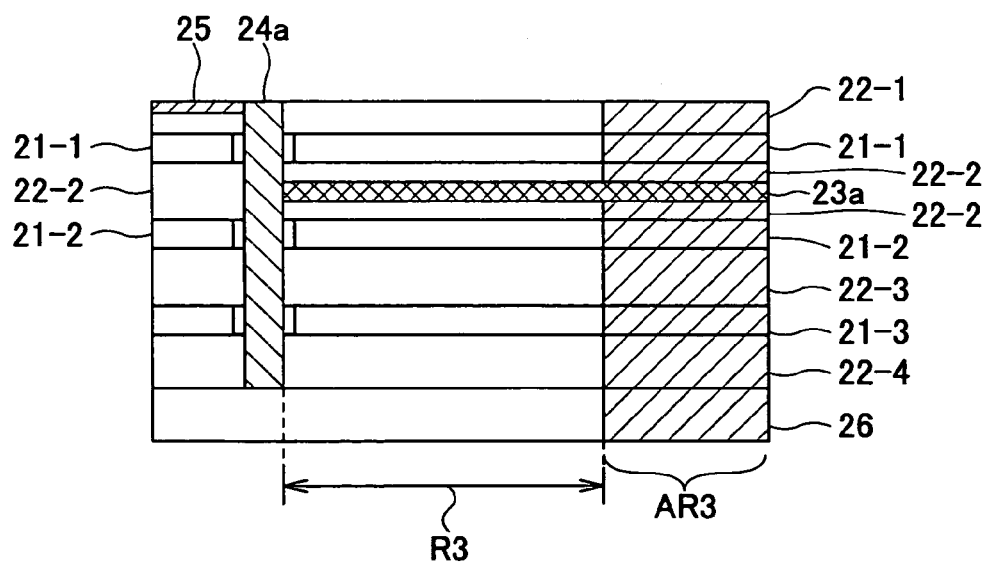
FIG. 4 is a cross-sectional view of the electric circuit shown in FIG. 2B along a line B-B.

The operations and functions of the circuit analyzer 10 according to an embodiment is described in the case where the circuit analyzer 10 analyzes an electric circuit apparatus shown in FIGS. 2-4.

FIG. 2A is a top view showing an electric circuit apparatus to be analyzed by the circuit analyzer 10. FIG. 2B is an expanded elevational view of the portion B of the top view shown in FIG. 2A. FIG. 3 is a cross-sectional view of the electric circuit apparatus along a line A-A shown in FIG. 2B. FIG. 4 is a cross-sectional view of the electric circuit apparatus along a line B-B shown in FIG. 2B.

Referring to FIGS. 2-4, the electric circuit apparatus 20 includes a substrate 26, three V/G layers 21-1 through 21-3 made of conductive material formed on the substrate, inter-layer insulative layers 22-1 through 22-4 formed on or between the V/G layers, two intra-layer signal wirings 23a and 23b parallel to the V/G layers 21-1 through 21-4 formed in the inter-layer insulative layer 22-2. The electric circuit apparatus 20 further includes piercing vias 24a and 24b connected to the intra-layer signal wirings 23a and 23b located at both ends of the electric circuit apparatus 20, and surface signal wiring 25 connected to the piercing vias 24a and 24b formed on the surface of the electric circuit apparatus 20. A signal fed to the surface signal wiring 25 on the left side of the electric circuit apparatus 20 is transmitted to the surface signal wiring 25 on the right side of the electric circuit apparatus 20 through: the piercing vias 24a and 24b on the left side, the inter-layer signal wirings 23a and 23b, and the piercing vias 24a and 24b on the right side.

Referring to FIGS. 1 through 4, the input unit 11 is provided with the 3 dimensional data of the electric circuit apparatus 20 by a CAD apparatus. The 3 dimensional data include the coordinates, widths, diameters, and electric properties of the substrate 26, the V/G layers 21-1 through 21-3, the inter-layer insulative layers 22-1 through 22-4, the intra-layer signal wirings 23a and 23b, and the piercing vias 24a and 24b.

The model replacement unit 12 computes a region in which mesh can be made sparse, and replaces, for example, the material of which the region is made with other material that makes the mesh to be formed therein sparse. Processing of the model replacement unit 12 is further described below with reference to FIGS. 5A and 5B.

Figure 5A:
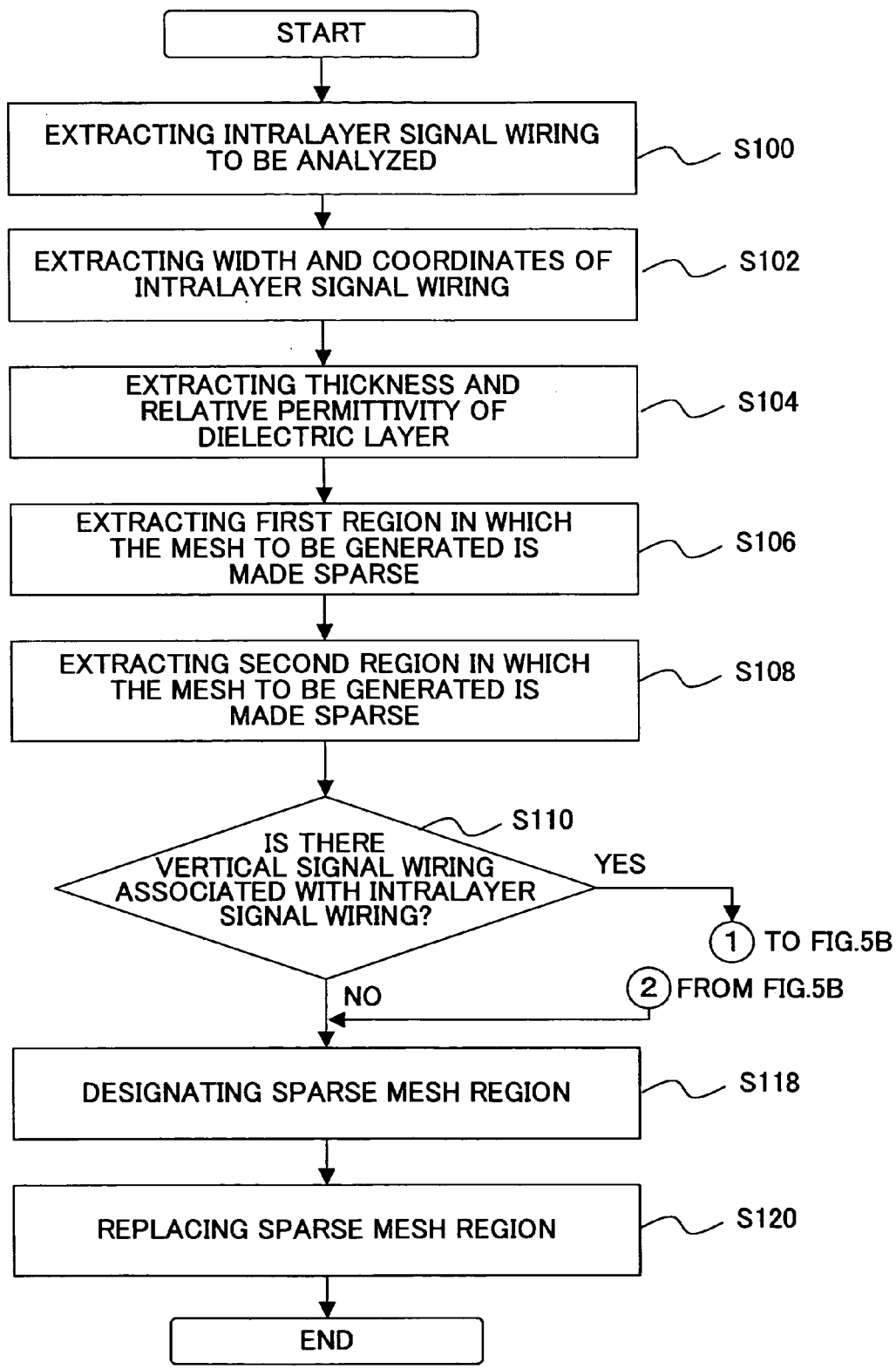
FIGS. 5A and 5B show a flowchart for explaining processing of a model replacement unit according to an embodiment.
Figure 5B:
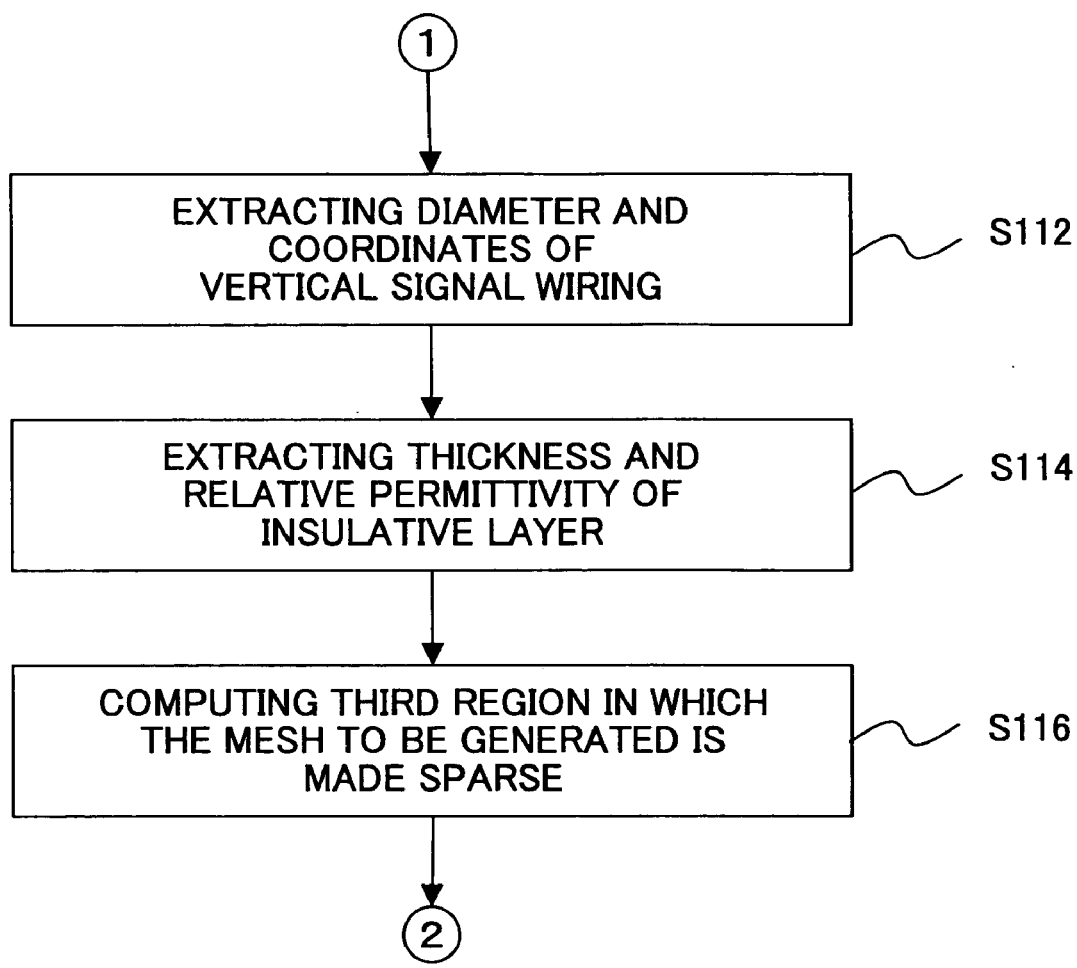

FIGS. 5A and 5B show a flow diagram for explaining processing of the model replacement unit.

The extracting unit 12a extracts the intra-layer signal wirings 23a and 23b (expandedly shown in FIG. 3) to be analyzed from the 3 dimensional data of the electric circuit apparatus 20 (S100). Then, the extracting unit 12a further extracts the width WD and coordinates of the intra-layer signal wirings 23a and 23b (S102).

Next, the computing unit 12b extracts the thickness TK and relative permittivity ϵ of the intra-layer insulative layer 22-2 in which the intra-layer signal wirings 23a and 23b are formed (S104).

Next, the computing unit 12b computes to identify a region AR1 (referred to as "first region") that affects the transmission characteristics of the signal wirings to only a small extent or that does not affect those of the signal wirings based on the width WD and coordinates of the intra-layer signal wirings 23a and 23b and the thickness TK and relative permittivity ϵ of the inter-layer insulative layer 22-2 (S106). The first region AR1 is included in the inter-layer insulative layer 22-2 and the V/G layers 21-1 and 21-2 touching the inter-layer insulative layer, and is separated from the intra-layer signal wirings 23a and 23b by a predetermined distance R1. The predetermined distance R1 may be determined experimentally or experientially. According to the present embodiment, the predetermined distance R1 is determined to be the product of one of the width WD of the intra-layer signal wirings 23a-23b and the thickness TK of the inter-layer insulative layer 22-2, whichever greater, and the relative permittivity ϵ of the inter-layer insulative layer 22-2. For example, assuming that the width WD of the intra-layer singal wirings 23a and 23b is 0.1 mm, the thickness TK of the inter-layer insulative layer 22-2 is 0.2 mm, and the relative permittivity ϵ of the inter-layer insulative layer 22-2 is 4.4, the distance R1 becomes 0.88 mm. The signal frequency and the dielectric loss of the inter-layer insulative layer 22-2 may be taken into account in order to determine the distance R1.

The computing unit 12b further computes to identify a region other than the inter-layer insulative layer 22-2 including the intra-layer signal wirings 23a-23b and the V/G layer 21-1 touching the inter-layer insulative layer as a region AR2 (referred to as "second region") that affects the transmission characteristics of the signal wirings to only a small extent or that does not affect those of the signal wirings based on the 3 dimensional data (S108). The second region is specifically the inter-layer insulative layers 22-1, 22-3, 22-4, the V/G layer 21-3, and the substrate. Since the intra-layer signal wirings 23a and 23b are between the V/G layers 21-1 and 21-2, the electric and magnetic field generated by the signal flowing the intra-layer signal wirings 23a and 23b does not leak much into the second region. As a result, even if the second region is divided with a sparse mesh, the result of electromagnetic field analysis may little change.

Next, a determination is made of whether there is any vertical signal wiring related to the intra-layer signal wiring to be analyzed (S110). This determination is made because, if there is a vertical signal wiring, the first and second regions may affect the transmission characteristics of the signal. If there is a vertical signal wiring, steps shown in FIG. 5B are performed. Specifically, the extracting unit 12a extracts the diameter RD and coordinates of the piercing vias 24a and 24b (expandingly shown in FIG. 4), that is, the vertical signal wirings (S112). Next, the computing unit 12b extracts the thickness TK and the relative permittivity ϵ of the inter-layer insulative layer 22-2 surrounding the piercing vias 24a-24b and the intra-layer signal wirings 23a-23b (S114).

The computing unit 12b computes to identify a region AR3 (referred to as "third region") that affects the transmission characteristics of the signal wirings to only a small extent or that does not affect those of the signal wirings based on the diameter RD and coordinates of the piercing vias 24a and 24b and the thickness TK and relative permittivity ϵ (S116). The third region AR3 (including portions of all the layers including the substrate 26 through the inter-layer insulative layer 22-1) is separated from the side wall of piercing vias 24a and 24b by a predetermined distance R3 or more. The predetermined distance R3 may be determined experimentally or experientially. However, according to this embodiment, the predetermined distance is determined to be the product of one of a half of the diameter RD of the piercing vias 24a-24b and the thickness TK of the inter-layer insulative layer 22-2, whichever greater, and the relative permittivity ϵ of the inter-layer insulative layer 22-2. For example, if the diameter RD of the piercing vias 24a-24b is 0.6 mm, the thickness TK of the inter-layer insulative layer 22-2 is 0.2 mm, and the relative permittivity ϵ of the inter-layer insulative layer 22-2 is 4.4, the distance R3 becomes 1.32 mm. The signal frequency and the dielectric loss of the inter-layer insulative layer 22-2 may be taken into account in order to determine the distance R3.

Returning to FIG. 5, an aggregate region (first region ∪ second region) in which the first region computed in step S106 and the second region computed in step S108 or, if a determination that there is a vertical signal wiring is made, an overlapping region ((first region ∪ second region) ∩ third region) in which the aggregate region and the third region computed in step S116 of FIG. 5B overlap is extracted, and is finally designated as the region (sparse mesh region) in which the mesh can be made sparse (S118). Specifically, the sparse mesh region is either the first region AR1 (FIG. 3) or the second region AR2 (FIG. 3) overlapping the third region (FIG. 4). On the other hand, if a determination that there is no vertical signal wiring is made, the third region is identical to the entire electric circuit apparatus 20. In such a case, the sparse mesh region becomes identical to the aggregate region (first region ∪ second region) in which the first region computed in step S106 and the second region computed in step S108.

The 3 dimensional data is modified, for example, by replacing the material of the sparse mesh region with another material that makes the mesh to be generated in the region sparse (S120). According to this arrangement, time required for the computing by the mesh generating unit 13 can be reduced. The other material that makes the mesh to be generated in the region sparse is, for example, complete conductor or air of which relative permittivity is substantially 1. Alternatively, the material of the sparse mesh region may be completely removed to make it "vacuum". Hereinafter, the term "air" includes the case in which the sparse mesh region is "vacuum." If the material of the sparse mesh region is replaced with the complete conductor, the mesh to be generated in the sparse mesh region is made sparse. If the material of the sparse mesh region is replaced with air (including the case of "vacuum"), no mesh is generated in the sparse mesh region. It is properly determined which, the complete conductor or the air, the sparse mesh region is to be replaced with.

Next, the mesh generating unit 13 generates mesh based on the 3 dimensional data of which model is replaced using a predetermined algorithm. Algorithms known in the art can be used as the predetermined algorithm. An example of the algorithms known in the art is described below.

The electric circuit apparatus 20 including the intra-layer signal wirings 23a and 23b, the V/G layers 21-1 through 21-3, and the inter-layer insulative layers 22-1 through 22-4 is divided by rectangles having a predetermined ratio of length and width. If the material of the sparse mesh region is replaced with air (including the case of "vacuum"), no mesh is generated in the sparse mesh region, which results in considerable reduction in the density of the mesh. According to the inventor's estimation, if the material of the sparse mesh region is replaced with the complete conductor, the density of the mesh in the sparse mesh region becomes 10% through 70% less than that of the mesh in the sparse mesh region before replacing the material.

The intra-layer signal wirings 23a and 23b may be divided into fractions of which length is one tenth (1/10) of the wavelength of the signal, and the mesh width may be proportionally increased to the distance from the intra-layer signal wiring. This is because the electric field and magnetic field is reduced as the distance from the intra-layer signal lines 23a and 23b is increased. The mesh width is increased spoke-wise as the distance from the piercing via increases in the neighborhood of the piercing vias 24a and 24b. According to the above arrangements, the mesh units can be reduced in number compared with the case the size of the mesh unit is uniformly determined. In the case where the electric circuit apparatus is divided as described above, no mesh is generated in the air region, and sparse mesh is generated in the complete conductor region. Accordingly, the number of mesh units can be reduced.

Next, the electromagnetic field analyzing unit 14 extracts the coordinates of the mesh generated by the mesh generating unit 13 and electric properties at the coordinates from the 3 dimensional data, and computes the transmission characteristics and the S parameter information (including its frequency dependency) of the intra-layer signal wiring using the electromagnetic field analysis method described above. The electromagnetic field analyzing unit 14 further computes the distribution of current in the intra-layer signal wiring and the characteristic impedance.

The output unit 15 may output the S parameter information, for example, to a memory unit and a storage unit such as a hard disk drive and an optical disk drive. The output unit 15 may output waveforms and the distribution of current in the intra-layer signal wiring, for example, to a printing unit such as a printer.

For example, the function of the circuit analyzer 10 is realized by a computer. That is, the transmission characteristics of the intra-layer signal wiring is obtained by performing the computer program described above.

According to the present embodiment, the material, for example, of a region that affects the transmission characteristics to a less extent is replaced with another material in which the mesh to be generated therein is made sparse. According to this arrangement, time required for analyzing the electric circuit apparatus can be reduced. According to the inventor's estimation, the number of the mesh units and the time required for analyzing the electric circuit apparatus are substantially proportional. If the number of the mesh units is halved, the required time becomes half.

According to the present embodiment, the sparse mesh region is automatically computed by a computer, and the 3 dimensional data of the electric circuit apparatus is replaced. The electric property parameters do not need to be combined after the electromagnetic field analysis compared with the case in which the electric circuit apparatus is divided with a dense mesh.

A circuit analyzer according to a variation of the present embodiment is described below. The circuit analyzer is configured in the same manner as the circuit analyzer 10 shown in FIG. 1 except for the function of the replacing unit 12c and the mesh generating unit 13.

FIG. 7 is a functional block diagram showing the circuit analyzer 40 according to the variation of the present embodiment. Elements that are identical or corresponding to those of the circuit analyzer 10 are referred to by the same reference numerals, and their description is omitted.

Figure 6:
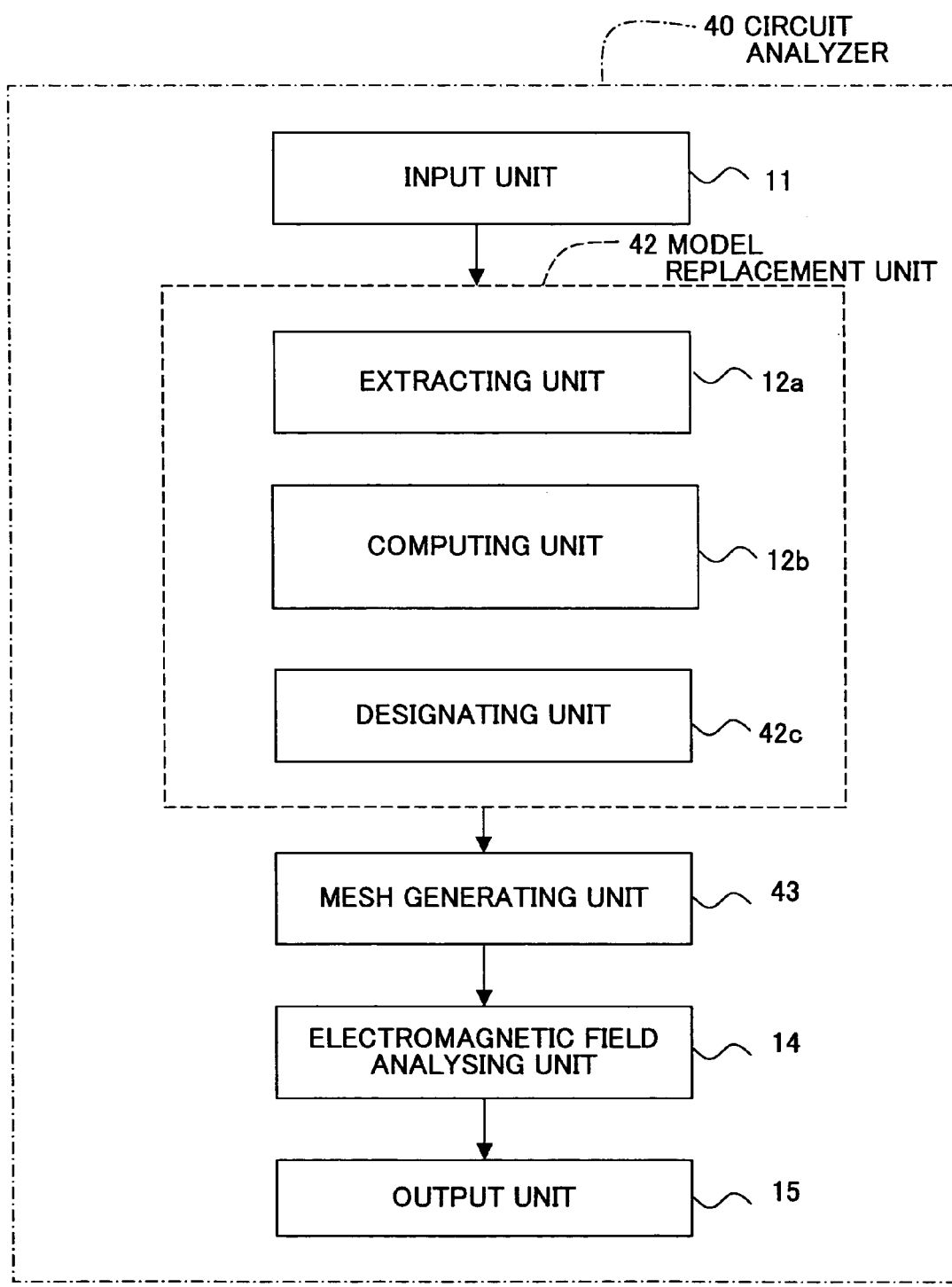
FIG. 6 is a block diagram showing the functional structure of a circuit analyzer according to a variation of the embodiment.

Referring to FIG. 6, the circuit analyzer 40 according to an variation includes an input unit 11 for inputting 3 dimensional data of an electric circuit apparatus, a model replacement unit 42 for designating a region that affect the transmission characteristics only to a small extent. The circuit analyzer 40 further includes a mesh generating unit 43 for dividing the electric circuit apparatus with mesh based on the 3 dimensional data, an electromagnetic analyzing unit 14 for analyzing the transmission characteristics of the signal wiring of the electric circuit apparatus, and an output unit 15 for outputting the analysis results.

A designating unit 42c included in the model replacement unit 42 designates a sparse mesh region ((first region ∪ second region) ∩ third region) in S118, and includes the sparse mesh region in the 3 dimensional data. Processing performed in step S120 in which, for example, the material of the sparse mesh region is replaced other material is not performed.

The mesh generating unit 43 performs processing in which the mesh to be generated is made sparse based on the data of the sparse mesh region in the operation of the mesh generating unit 13. In the sparse mesh region, the number of mesh units may be reduced or no mesh may be generated.

According to this variation, the number of mesh units can be reduced, and time required for analyzing the electric circuit apparatus can be reduced.

The present invention is not limited to these embodiments, but various variations and modifications may be made without departing from the scope of the present invention.

For example, the present invention has been described using the circuit analyzers 10 and 40 that can analyze an electric circuit apparatus. However, the present invention is also applicable to the analysis of the signal wiring in an electronic circuit board and/or an integrated circuit.

In summary, according to the present invention, since the number of mesh units can be reduced, the time required for analyzing the circuit apparatus can be reduced. Additionally, in comparison with conventional analysis of the electromagnetic field by dividing the circuit apparatus into portions, the electric property parameters obtained by the electromagnetic field analysis do not need to be combined.

This patent application is based on Japanese Priority Patent Application No. 2004-134383 filed on Apr. 4, 2004, the entire contents of which are hereby incorporated by reference.

What is claimed is:

1. A method of analyzing transmission characteristics of signal wiring in a circuit apparatus including the signal wiring and an insulative layer surrounding the signal wiring by dividing the circuit apparatus with a mesh and applying an electromagnetic analysis method to each unit of the mesh, the method comprising:

extracting signal wiring data of the signal wiring from three-dimensional data of the circuit apparatus;

designating a sparse mesh region in which the mesh can be made sparse based on the extracted signal wiring data and the three-dimensional data of the circuit apparatus; and generating sparse mesh in the sparse mesh region, wherein the sparse mesh region is designated, based on sizes of the signal wiring and the insulative layer and on electric properties of the insulative layer.

2. The method as claimed in claim 1, wherein:

when generating sparse mesh in the sparse mesh region, material of which the designated sparse mesh region is made is changed to another material so that the mesh to be generated in the sparse mesh region is made sparse.

3. The method as claimed in claim 2, wherein:

the other material is one of complete conductor and insulator of which relative permittivity is substantially 1.

4. The method as claimed in claim 1, wherein:

the circuit apparatus further includes upper and lower power supply/ground layers and a first inter-layer insulative layer, formed alternately, the signal wiring being formed in the first inter-layer insulative layer; and the sparse mesh region is provided in the first inter-layer insulative layer surrounding the intra-layer signal wirings and the upper and lower power supply/ground layers, and is distant by a first distance or more from the intra-layer signal wirings in the direction parallel to the layers and perpendicular to the intra-layer signal wirings.

5. The method as claimed in claim 4, wherein:

the first distance is determined based on the width of the intra-layer signal wirings and the thickness and relative permittivity of the first inter-layer insulative layer.

6. The method as claimed in claim 4, wherein:

the sparse mesh region includes a region over the upper power supply/ground layer and a region below the lower power supply/ground.

7. The method as claimed in claim 4, wherein:

the circuit apparatus further comprises a vertical signal wiring electrically connected to the intra-layer signal wiring; and the sparse mesh region is distant from the vertical signal wiring by a second distance in a direction parallel to the layers.

8. The method as claimed in claim 7, wherein:

the second distance is determined based on the diameter of the vertical signal wiring, and the thickness and relative permittivity of the first inter-layer insulative layer.

9. A computer-readable medium storing a program analyzing transmission characteristics of signal wiring in a circuit apparatus including the signal wiring and an insulative layer surrounding the signal wiring by dividing the circuit apparatus with a mesh and applying an electromagnetic analysis method to each unit of the mesh, said program causing a computer to execute:

extracting signal wiring data of the signal wiring from three-dimensional data of the circuit apparatus;

designating a sparse mesh region in which the mesh can be made sparse based on the extracted signal wiring data and the 3 dimensional data of the circuit apparatus; and generating sparse mesh in the sparse mesh region, wherein the sparse mesh region is designated, based on sizes of the signal wiring and the insulative layer and on electric properties of the insulative layer.

10. An apparatus analyzing transmission characteristics of signal wiring in a circuit apparatus including the signal wiring and an insulative layer surrounding the signal wiring by dividing the circuit apparatus with a mesh and applying an electromagnetic analysis method to each unit of the mesh, the apparatus comprising:

a model replacement unit that identifies region data in three-dimensional data of the circuit apparatus in which the mesh is to be made sparse; and a mesh generating unit that generates sparse mesh in the region based on the three-dimensional data, wherein the region is designated based on the size of the signal wiring and the insulative layer and the electric properties of the insulative layer.

* * * * *

UNITED STATES PATENT AND TRADEMARK OFFICE
CERTIFICATE OF CORRECTION

PATENT NO.         : 7,266,794 B2
APPLICATION NO. : 10/939336
DATED              : September 4, 2007
INVENTOR(S)        : Manabu Yamazaki It is certified that error appears in the above-identified patent and that said Letters Patent is hereby corrected as shown below:

First Page, Column 2 (Other Publications), Line 7, change "teh" to --the--.

First Page, Column 2 (Other Publications), Line 8, change "Methodoloty," to --Methodology,--.

First Page, Column 2 (Other Publications), Line 9, change "Clrcuit" to --Circuit--.

Signed and Sealed this

Eleventh Day of December, 2007

JON W. DUDAS
*Director of the United States Patent and Trademark Office*